United States Patent [19]

Penza et al.

[11] Patent Number: 5,581,563
[45] Date of Patent: Dec. 3, 1996

[54] DESIGN FOR TESTABILITY TECHNIQUE OF CMOS AND BICMOS ICS

[75] Inventors: Luigi Penza, Vimercate; Michele Favalli; Bruno Riccó, both of Bologna, all of Italy

[73] Assignee: SGS-Thomson Microelectronics, S.r.l., Agrate Brianza, Italy

[21] Appl. No.: 379,317

[22] Filed: Jan. 24, 1995

[30] Foreign Application Priority Data

Jan. 24, 1994 [EP] European Pat. Off. ............ 94830023

[51] Int. Cl.$^6$ .................................................. G06F 11/00
[52] U.S. Cl. ........................................ 371/22.1; 371/22.5
[58] Field of Search ..................... 398/183.03, 183.06; 371/22.1, 22.5, 22.6, 25.1

[56] References Cited

U.S. PATENT DOCUMENTS 5,025,344  6/1991  Maly et al. .................................. 361/88
5,390,193  2/1995  Millman et al. ............................ 371/27

OTHER PUBLICATIONS

"Random Current Testing for CMOS Logic Circuits by Monitoring a Dynamic Power Supply Current" by Tamamoto et al, Dept. of Information Engineering, Mining College, Akira University Sep. 7, 1992.

"Design of ICs Applying Built–In Current Testing" by Maly et al., Journal of Electronic Testing: Theory And Applications Dec. 1992.

Primary Examiner—Vincent P. Canney
Attorney, Agent, or Firm—Robert Groover; Betty Formby

[57] ABSTRACT

A DFT technique for the detection of bridging faults in CMOS and BiCMOS logic ICs, employs purposely integrated monitoring inverters, driven by signal nodes of the functional circuits to be tested, for revealing the presence of intermediate voltages of a critical value. The monitoring inverters are supplied through a dedicated shadow line that is connected to either one of the supply rails of the functional circuits through a load: a resistance, for a static implementation, or a capacitor, for a dynamic (clocked) implementation. Absence of series connected built-in current sensors (BICSs) avoids degradation of the performance of the functional circuits and is compatible with scaling down of the power supply and with on-line testing techniques. Only critical bridging faults may be reliably and selectively detected, thus reducing the number of rejects, failing a conventional IDDQ test. In a modified embodiment, a DFT scheme of the invention may be adapted to reveal also stuck-at faults, by connecting together the output nodes of certain monitoring inverters to create activatable current paths from a test node (shadow line) and a supply rail of the IC.

47 Claims, 2 Drawing Sheets

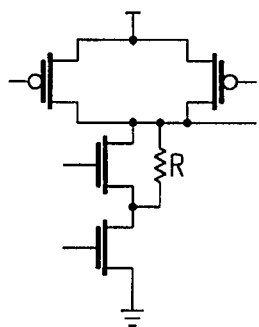
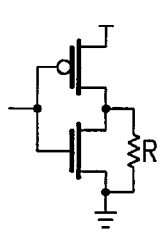
FIG. 1a  FIG. 1b
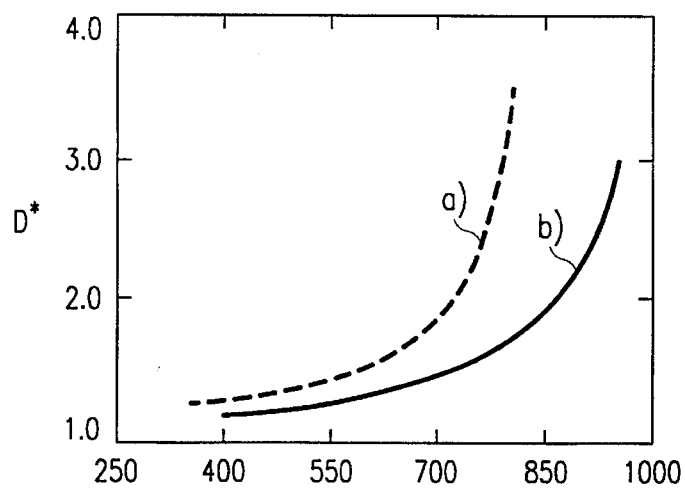
FIG. 2
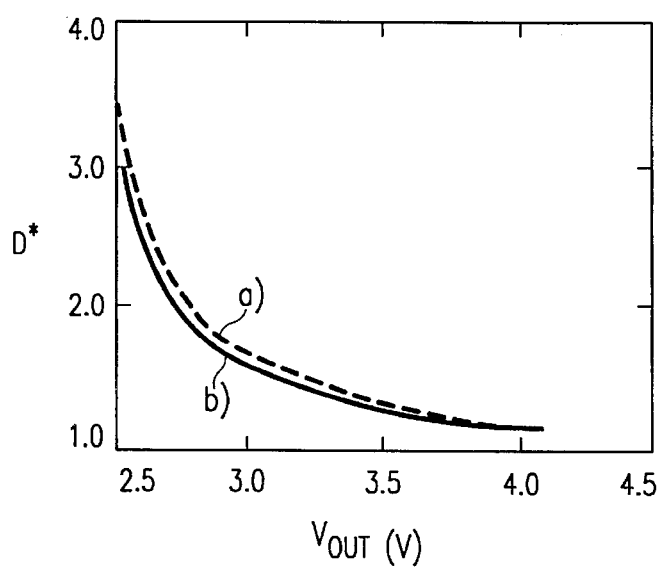
FIG. 3

DESIGN FOR TESTABILITY TECHNIQUE OF CMOS AND BICMOS ICS

CROSS-REFERENCE TO RELATED APPLICATION

This application claims priority from EP 94830023.1, filed Jan. 24, 1994, which is hereby incorporated by reference. However, the content of the present application is not necessarily identical to that of the priority application.

BACKGROUND AND SUMMARY OF THE INVENTION

The present invention relates to a new Design-For-Testability (DFT) technique aimed at detecting critical bridging faults, i.e. faults producing unacceptable extra delays in signal propagation, in CMOS and BiCMOS ICs. The invention overcomes the most important drawbacks of known DFT techniques based on built-in current sensors, by not requiring test devices in series with the functional blocks, thus minimizing the effects on circuit performance. Moreover it is capable of selectively detecting only faults that are really critical for the circuit operation, thus optimizing the margin for device rejection.

As is known, the testing of CMOS and BiCMOS ICs cannot be based on the assumption that all significant faults can be represented by means of the conventional stuck-at model. See J. A. Abraham and W. K. Fuchs, "Fault and Error Models for VLSI", 74 PROC. IEEE 639–654 (1986), which is hereby incorporated by reference.

In practice, a large portion of failures encountered in real circuits can be explained by the use of the so-called (resistive) bridging model 2 (herein considered to include also so-called stuck-on transistor faults), which implies the presence of a conductive path between power supply and ground. See H. Hao and E. McCluskey, "'Resistive Shorts' within CMOS Gates", in PROC. IEEE INTL. TEST CONF. 292–301 (1991), which is hereby incorporated by reference.

Such (resistive) bridging faults cause two main consequences:

1) the voltage at the output of a functional circuit (macro-gate or macro-cell) may assume "intermediate" values;
2) a static current, commonly denoted IDDQ, flows from the power supply to ground.

As a result of the first effect, logic errors may or may not be produced according to whether or not the intermediate output voltages assumed by faulty (macro-)cells, lay on the same side of the logic threshold level of the fan-out gates, as in the correct situation. See M. Favalli, P. Olivo, M. Damiani and B. Riccò, "Fault Simulation of Unconventional Faults in CMOS ICs", 10 IEEE TRANSACTION ON CAD 677–682 (1991), which is hereby incorporated by reference.

Hereinafter, bridging faults (BFs) that may give rise to logic errors will be denoted LBFs, while others bridging faults that will not cause logic errors will be denoted as NLBFs.

In general, BFs must be detected, essentially because they inevitably degrade the circuit dynamic performance, while other effects, such as the extra power consumption associated with the IDDQ current, may be disregarded in many applications.

While LBFs can be detected essentially in the same way as stuck-at faults, NLBFs require special detection techniques. To this end, the second effect, mentioned above, may be exploited by sensing the presence of a "non-negligible" IDDQ. See Y. K. Malaiya and S. Y. H. Su, "A New Fault Model and Testing Technique for CMOS Devices", in PROC. IEEE INT. TEST CONF. 25–34 (1982); and L. Horning, J. Soden, R. Fritzmeier and C. Hawkins, "Measurements of Quiescent Power Supply Current for CMOS ICs in Production Testing", in PROC. IEEE INT. TEST CONF., 300–309 (1987); both of which are hereby incorporated by reference.

Indeed, this possibility is interesting, because a test for the presence of a static current could reveal the existence of both LBFs and NLBFs.

Moreover, IDDQ testing is potentially very effective and concise, because it merely requires fault activation (also for the detection of LBFs). In general, faults giving rise to measurable IDDQ can be detected with a set of test vectors much smaller than those of conventional ATPG algorithms. See P. Nigh and W. Maly, "Test Generation for Current Testing", in PROC. IEEE EUR. TEST CONF. 194–200 (1989), which is hereby incorporated by reference.

For these reasons IDDQ testing is attracting considerable interest, and, in conjunction with the trend toward increasing use of Design-For-Testability (DFT) techniques, significant efforts have been dedicated to the development of Built-In Current Sensors (BICSs) to be normally exploited as a complement tool of standard, stuck-at-model-oriented test methods, which are still largely implemented in an off-chip mode. See L. Horning, J. Soden, R. Fritzmeier and C. Hawkins, "Measurements of Quiescent Power Supply Current for CMOS ICs in Production Testing", in PROC. IEEE INT. TEST CONF. 300–309 (1987); D. Feltham, P. Nigh, R. Carley and W. Maly, "Current Sensing for Built-In Testing of CMOS circuits", in PROC. IEEE INT. CONF. COMPUTER DESIGN 454–457 (1988); and C. Hawkins, J. Soden, R. Fritzmeier and L. Horning, "Quiescent Power Supply Current Measurement for CMOS IC Defect Detection", 36 IEEE TRANS. INDUSTRIAL ELECTRONICS 211–218 (1989); all of which are hereby incorporated by reference.

A major drawback of all BICSs developed so far, is that they feature extra-devices (MOSFETs, BJTs, resistances, ...) in series with the functional circuit. The presence of such devices tends to degrade the dynamic performance of the functional circuit and it is necessary to realize these "extra-devices" with a considerably large area in order to minimize their negative effect. Above all, the use of series connected current sensors is incompatible with the trend toward scaled-down power supplies.

There is a need or utility for an improved DFT technique for testing for the existence of critical resistive bridging faults in CMOS and BiCMOS ICs that does not cause the above noted drawbacks of the known methods employing BICSs.

These objectives are satisfied by the DFT system of the present invention which is based on monitoring the presence of intermediate voltages at signal nodes of CMOS or BiCMOS logic ICs, rather than anomalously high static currents. Advantageously, the monitoring may be focused on a pre-established range of intermediate voltages, thus rendering the novel system of the invention intrinsically selective, namely able to reveal the presence of only BFs of actual concern for the correct operation of the circuit.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 shows two typical schemes of resistive bridging faults that may occur in logic gates;

FIG. 2 shows the typical increase of propagation delay D' along a circuit path due to the presence of one or of the other type of faulty logic circuit depicted in FIG. 1, as a function of the value of the bridging resistance R, here equivalently represented by a measured IDDQ;

FIG. 3 shows the increase of propagation delay D' along a circuit path due to the presence of one or of the other type of faulty logic circuit, in function of intermediate output voltage assumed for the two examples of faulty gate of the preceding figures;

DETAILED DESCRIPTION OF THE PREFERRED EMBODIMENTS

Figure 4:
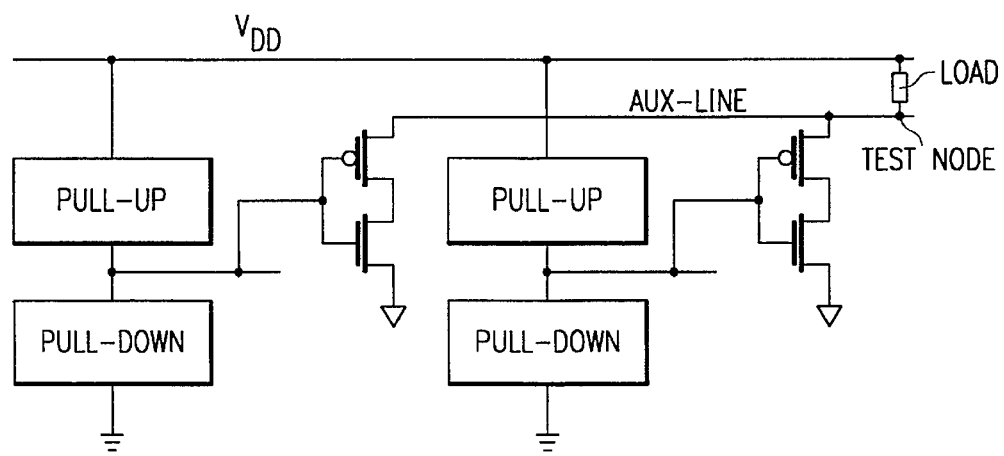
FIG. 4 is a schematic diagram of a DFT architecture of the invention.

The numerous innovative teachings of the present application will be described with particular reference to the presently preferred embodiment (by way of example, and not of limitation), in which:

As pointed out before, the least tolerable effect of BFs is the degradation of the dynamic performance of the circuit. In turn, fault-induced extra delays unambiguously reveal the existence of BFs, namely of faults that produce a delay in excess of a certain maximum (tDMAX) tolerable delay, along a critical signal path.

A crucial point that has been recognized is that it is not possible to establish a reliably solid relationship between fault induced extra delays and the level of a static current, because IDDQ depends on the actual resistance of the fault induced conductive path between a power supply rail and ground, while the increase of propagation delay depends mainly on a ratio between competing conductances (also because of the incomplete driving of the fan-out (macro-)gates). In other words, the IDDQ value is not a good indicator for delay-oriented faults detection.

This can be clearly seen in the diagram of FIG. 2, wherein the relative increase of the propagation delay along a typical signal path comprising a faulty logic circuit and two additional levels of fan-out logic (in order to account for a degradation of performance of fan-out gates), as a function of IDDQ (made to vary by changing the value R of the relative bridging fault resistance), is shown for the two types of faults a) and b) schematically depicted in FIG. 1.

As can be observed, the same value of IDDQ may produce substantially different extra delays, depending on the structure of the circuit.

The situation depicted in FIGS. 1 to 3, is substantially independent of the actual structure of a logic (macro-)cell taken in consideration, as verified by a large number of electrical level simulations.

On the other hand, as clearly depicted in FIG. 3, it has been found that a useful strong relationship exists between extra delays and the value of the intermediate voltage assumed by the output node of a (macro-)cell affected by a BF. The most dangerous, fault induced intermediate voltages are those close to the cell's logic threshold. Such faulty conditions cause the maximum current diversion to the output node capacitance and the minimum transistor overdrive in fan-out cells, without necessarily producing (static) logic errors.

The new test approach of the present invention, based on the sensing of these intermediate voltages, has been found to minimize the number of circuits that are not unable to pass the conventional IDDQ test. Such a test, in fact, has proved to be far too grossly severe and therefore caused the rejection of components that would be able to operate correctly, though in the presence of relatively high static current levels.

In addition, the detection of fault-induced intermediate voltages at (macro-)cells outputs can be done without any need to interrupt or affect their normal operation.

For these reasons, the present invention can be outstandingly useful also for implementing on-line testing of devices (i.e. to implement self-checking procedures), and this aspect represents per se another significant advantage compared with alternative prior art test methods.

The method of the present invention can be implemented in a static mode as well as in a clocked one, as will be illustrated later and in either embodiment it may be implemented with a variety of possible design options.

An essential feature of the DFT architecture of the present invention is the presence of at least an auxiliary (or shadow) supply line (AUX-LINE), beside the normal supply rails VDD and GND (ground) that power the functional logic (macro-)cells of the integrated circuit. Such a shadow supply line AUX-LINE may be "connected" through a load to either one of the two supply rails, to VDD or to GND, of the functional CMOS or BiCMOS (macro-)cells of the IC, indifferently.

Figure 5:
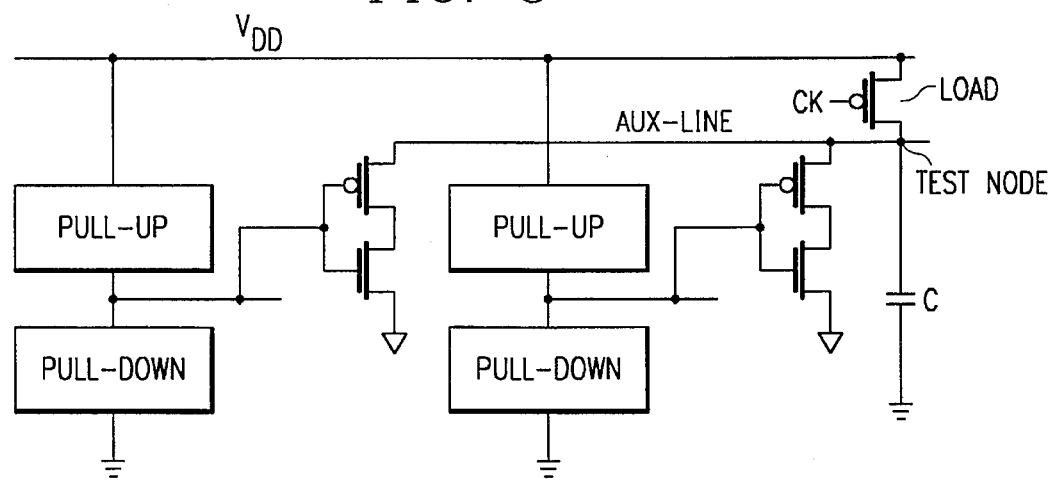
FIG. 5 is a schematic diagram of a docked-mode embodiment of a DFT architecture of the invention.

In the embodiments shown in the FIGS. 4 and 5, for purely illustrative purposes, the shadow supply line AUX-LINE is shown connected through a load (LOAD) to the VDD line, however it is clear that the DFT architecture of the invention may equally be realized by connecting the shadow line through a load to the other supply rail that is to ground.

Another feature of the DFT scheme of the invention, is the realization of a test inverter for each (macro-)cell to be monitored. Each test inverter stage is electrically connected to a shadow supply rail AUXLINE and to the other of the two supply rails of the functional CMOS or BiCMOS (macro-)cells of the IC and has an input connected to an output node of the monitored CMOS or BiCMOS (macro-)cell.

Each test inverter stage monitors the intermediate voltage that is assumed by the output node of a respective gate or (macro-)cell, by providing a conductive path between the shadow supply line and the "other" supply rail of the circuit when the voltage assumed by the output node of the monitored cell has an intermediate level, falling within a pre-established intermediate voltage range that can be determined by appropriately designing the test inverter, that is the n-channel and p-channel transistors that compose the inverter stage.

It is evident that each test inverter may be designed so as to define certain triggering levels that may be designed so as to be "safely" close to the logic threshold level of the cell being monitored by the inverter, thus implementing an accurately selective testing of the IC's (macro-)cells. In this way, the number of failures (rejects) can be narrowed to only those devices denouncing the existence of truly critical resistive bridging faults.

Of course, an IC may have a large number of (macro-)cells monitored by a DFT structure as the one shown in FIG. 4, that will produce a cumulative test signal across the load impedance (for example a resistance) connecting the shadow supply line AUX-LINE to the supply rail of the functional circuits (VDD in the example shown). Of course, the DFT test arrangement depicted in FIG. 4, may also be repeated any number of times over the whole chip. In such a case of a "distributed" embodiment, a plurality of test signals, respectively produced across the load of each of a plurality of shadow supply lines, may be summed together in order to produce a single logic output that can be interpreted according to an appropriate algorithm by dedicated circuitry.

According to a specific embodiment of the invention, logic circuits featuring at least two signal nodes that should always be in the same logic state may be tested also for the existence of stuck-at faults, by modifying the test scheme of the invention, as will be described later.

STATIC IMPLEMENTATION

A simplest, static, implementation of the invention, features a resistive load (LOAD) that may be realized typically with a simple transistor, in series with either the power supply line VDD (as shown in FIG. 4) or ground. This simple scheme, employing a resistive load toward the power supply line VDD, of FIG. 4, will now be discussed in some details, since other, functionally equivalent, alternative embodiments may be easily derived from this by a skilled person.

The basic operation of such a static scheme is very simple. The presence of an intermediate voltage at the output of a monitored (macro-)cell, falling within a certain intermediate voltage range, will "open" a conductive path between the relative shadow supply (AUX-LINE) and ground, through the respective test inverter. Under these conditions, a static current will flow through the load, causing the voltage at the test node to drop. Such a voltage drop, can then be easily read by a suitable circuit, in order to produce a standard logic value at the output of the test circuitry.

As already stressed, the method of the invention, does not require any element in series with the functional circuit, whose performance is therefore minimally affected by an increase in load impedance.

When a plurality of test signals, readable on distinct test nodes, each relating to one of a plurality of DFT networks, as the one depicted in FIG. 4, are produced within the same IC, these test signals may be collected at the inputs of a network implementing a NOR (NAND) function, so as to produce a single logic output.

In general, this arrangement will simplify the electrical design of the scheme (because it would lead to a more balanced inverter/load trade-off ratio), but it could also significantly complicate the layout of signal and power distribution on the chip. Therefore, for simplicity and convenience, reference will be made to the case of a single shadow line-single load per chip.

DESIGN CONSIDERATIONS

As far as the realization of the test inverters is concerned, a starting parameter for their design is the range of intermediate voltage to be detected. In principle, the design range of critical intermediate voltages will be determined by fixing the maximum tolerable extra delay. The minimum value of detectable current on the load, that will depend on the sensitivity of output circuitry of the test scheme, is the other design parameter to be kept in consideration.

Once these parameters are fixed, the test inverters can be easily designed, by compensating also the presence of the load in order to maximize their static current for an input voltage equal to the logic threshold voltage of the functional (macro-)cell to be monitored.

The resistive load that connects the shadow line to one or the other of the two supply rails, can be realized in various ways; typically a p- or an n-channel MOSFETs in series with the power supply or ground, respectively, will represent a satisfactory load.

As far as the "overhead" layout is concerned, it is undoubtedly true that the necessity to realize a shadow supply line or a plurality of such shadow lines represents a burden. However, it should be recognized that such a shadow line may be rather resistive (because its resistivity can be considered to a large extent as a part of the resistive load). Therefore such a shadow line may be as narrow as allowed by the available patterning technology. Moreover, in view of the fact that it can simply run parallel to the "main" supply line, it can be realized as a parallel metal strip having a width that is a small fraction of the width of the main supply line, without significantly complicating the layout (routing).

Once defined the maximum acceptable increase in rise/fall propagation delays of eventually faulty signal paths, a voltage threshold can be determined by referring to diagrams as that shown in FIG. 3. For example for a 5 V IC, to a limit additional delay larger than 50% of the nominal propagation delay, could correspond an intermediate voltage threshold range comprised between 3.25 V and 1.75 V, if a symmetric gate design is assumed.

In a situation as the one represented by the schemes and the diagrams of FIGS. 1 to 3, and by adopting a symmetric design of test inverters, the minimum current flowing through an inverter driven by a faulty gate output node could be approximately equal to 110 µA, which may correspond to about 40% of the current that would flow through the test inverter when the test inverter is on its logic threshold.

CLOCKED IMPLEMENTATION

The invention can also be readily implemented without employing a resistive load for connecting the shadow supply line, by employing a capacitor or exploiting the parasitic capacitance at the shadow power supply, according to a dynamic scheme, featuring a reset operation.

This alternative embodiment is shown in FIG. 5. Again, for simplicity, the case of a single sensing circuit, instead of a "distribution" of a plurality of test circuits, is considered.

Referring to the circuit diagram of FIG. 5, the capacitor C may be represented by the parasitic capacitance of the shadow supply line AUX-LINE. At the beginning of each clock period (CK), the test node is reset to VDD, that is the capacitor C is discharged, by turning on the transistor TR.

Successively, when all transients in the functional circuit have decayed, TR is switched off. In this condition, if no critical intermediate voltage is present at a (macro-)cell output, the test node remains at a high voltage (of course, for a limited time, as in all dynamic circuits). If, instead, fault-induced intermediate voltages open conductive paths (through one or more test inverters connected to the shadow supply line), the test node rapidly discharges to ground potential and an error signal can be produced.

In this case, given the range of intermediate signal voltages to be detected (recognized as faulty) and the clock period, the design of the test inverters can proceed as follows. The intermediate voltage to be detected specifies the transistor's overdrive of the test inverters, thus the current through such inverters can be fixed by considering the actual value of the capacitance C, to ensure a sufficiently fast discharging of the test node in the available fraction of the clock period.

This clocked scheme has the advantage of producing a negligible power consumption during a test phase (because it does not produce static currents). Moreover, by turning off the transistor TR, during normal IC operation, the test inverters will not contribute to the dynamic power dissipation either.

However, a clocked scheme may be slightly more complex and may require a somewhat larger silicon area (particularly in a version featuring a "distributed" test scheme with a number of distinct capacitances).

BRIDGING AND STUCK-AT FAULTS DETECTION

Figure 6:
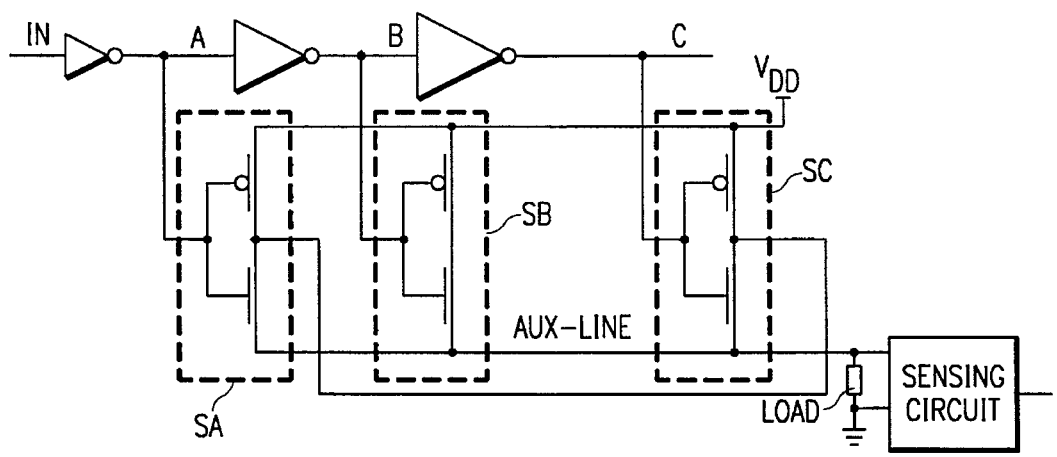
FIG. 6 shows an embodiment of the invention in a DFT arrangement for detecting bridging faults and also stuck-at faults in buffers.

A modified embodiment of the invention is illustrated in FIG. 6. The particular application described in FIG. 6 relates to an efficient DFT testing scheme for revealing bridging faults and also stuck-at (and of course also transistor stuck-open) faults within buffers or in any other circuit featuring two nodes that should always have an identical logic value, under fault-free (LBF-free) conditions. In practice the scheme is able to reveal any fault that could result in any logic error.

A three-stage buffer that may be composed of three cascaded inverters is considered, as an example.

According to the present invention, the "monitoring" inverters SA, SB and SC have their respective inputs connected to the output nodes of the three cascaded inverters of the functional logic circuit. The monitoring or sensing inverters SA, SB and SC are electrically connected to the supply rail VDD and to a shadow supply rail AUX-LINE, which is connected to the ground rail through a load.

The modification of the test scheme that is introduced for revealing also stuck-at 0/1 faults on the signal nodes A, B and C, is represented by the connection between the outputs of the first (SA) and of the last (SC) monitoring inverter, which functionally should be sensing signals of the same logic value.

Also in this modified embodiment, the test scheme remains capable to detect intermediate voltages that would cause untolerable extra delays in signal propagation through the chain of inverters that form the buffer.

Moreover, stuck-at 0/1 faults are revealed as follows.

By assuming: IN=0 and the signal node B stuck-at 1, the values of B and C will differ from the values of a fault-free situation. In particular, A will be at a logic 1 value, while C will be at 0 instead of 1. Hence, the n-channel transistor of SA will be ON while the value of C maintains (incorrectly) ON a p-channel transistor of SC. Current may flow from VDD to ground through the path formed by the pull-down and the pull-up devices of SA and SC, respectively, thus revealing the stuck-at fault.

According to a disclosed class of innovative embodiments, there is provided: An integrated circuit, comprising: first and second power supply connections; a plurality of logic cells, each including CMOS logic gates and providing at least one respective output node; a shadow supply line, connected to said first power supply connection through a load element; a plurality of CMOS monitoring gates, each connected between said shadow supply line and said second power supply, and each connected to receive the voltage of one of said output nodes; and circuitry for detecting whether said shadow supply line has been pulled to a voltage which indicates that one or more of said CMOS monitoring gates are receiving voltages which are not proper logic levels.

According to another disclosed class of innovative embodiments, there is provided: An integrated circuit, comprising: first and second power supply connections; a plurality of logic cells, each including CMOS logic gates and providing at least one respective output node; a shadow supply line, connected to said first power supply connection through a load element; a plurality of CMOS monitoring gates, each connected between said shadow supply line and said second power supply, and each connected to receive the voltage of one of said output nodes; and circuitry for detecting whether said shadow supply line has been pulled to a voltage which indicates that one or more of said CMOS monitoring gates are receiving voltages which are not proper logic levels; wherein first and second ones of said monitoring gates have respective intermediate nodes connected together, and are respectively connected to receive, as input voltages, the voltages of first and second ones of said output nodes which are expected to be complementary under static conditions.

According to another disclosed class of innovative embodiments, there is provided: A method for internally detecting faults in an integrated circuit, comprising the steps of: operating a plurality of logic cells, each including CMOS logic gates and providing at least one respective output node, from the voltages provided by first and second power supply connections; pulling a shadow supply line toward said first power supply connection, by a connection through a load element; operating a plurality of CMOS monitoring gates, which are each connected between said shadow supply line and said second power supply, and each connected to receive the voltage of one of said output nodes as an input; and monitoring the voltage of said shadow supply line, and indicating a fault condition if said shadow supply line has been pulled to a voltage which indicates that one or more of said CMOS monitoring gates are receiving voltages which are not proper logic levels.

According to another disclosed class of innovative embodiments, there is provided: A method for internally detecting faults in an integrated circuit, comprising the steps of: operating a plurality of logic cells, each including CMOS logic gates and providing at least one respective output node, from the voltages provided by first and second power supply connections; pulling a shadow supply line toward said first power supply connection, by a connection through a load element; operating a plurality of CMOS monitoring gates, which are each connected between said shadow supply line and said second power supply, and each connected to receive the voltage of one of said output nodes as an input; and monitoring the voltage of said shadow supply line, and indicating a fault condition if said shadow supply line has been pulled to a voltage which indicates that one or more of said CMOS monitoring gates are receiving voltages which are not proper logic levels; wherein first and second ones of said monitoring gates have respective intermediate nodes connected together, and are respectively connected to receive, as input voltages, the voltages of first and second ones of said output nodes which are expected to be complementary under static conditions.

According to another disclosed class of innovative embodiments, there is provided:

The "monitoring" inverters SA, SB, SC can have minimum sizes for the process used, or can be modified (as will be obvious to those skilled in the art) to provide a different sensitivity in interpreting the test signal. (Of course, the kind of load elements used (static or dynamic) will also be relevant in some cases.)

The choice of inverter sizings will determine the specific intermediate voltage range tested for; for one example, in case of resistive load (constituted by a minimal area p transistor), with an inverter sizing in which the W/L of the PMOS device is 4 times that of the NMOS device, it is possible to detect intermediate voltages in a range 1.85 V and 3.15 V (the power supply is at 5 V and the logic threshold is at 2.5 V). In this example, the "intermediate range" tested for is the middle 25% of the rail-to-rail range. Alternatively, the intermediate range in this example can be regarded as including a range of 43% of the difference from the logic switching voltage (2.5 V) to the voltage where all crossbar current stops (approximately 1 V or 4 V in this example). If the range of voltages which fall within the "intermediate range" are is made larger, more sensitive detection of faults will be achieved; if this range is made smaller, the number of parts which fail testing will be reduced. In any case, the intermediate range tested for will be narrower than the range from VSS+VTN to VDD−|VTP|, since the current for voltages at the boundary of such an interval would be too low to allow for sufficient voltage drop.

The invention is particularly advantageous in connection with standard-cell libraries, since the necessary initial design work to provide the monitoring gates can be built into the various cell designs (although not necessarily into every version of every functional block).

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the "intermediate range" tested for can optionally be made larger or smaller than the middle 25% of the rail-to-rail range.

For another example, the "intermediate range" tested for can optionally be made to include a range of one-third, half, or even two-thirds, of the difference from the logic switching voltage (2.5 V) to the voltage where all crossbar current stops.

For another example, multiple shadow supply rail segments can be used, with separate loads for each shadow supply rail segment.

For another example, it is optionally possible to combine a shadow supply rail as in FIGS. 4 or 5 (connected to VDD through a load) with a shadow supply rail as in FIG. 6 (connected to VSS through a load).

What is claimed is:

1. An integrated circuit, comprising:
   first and second power supply connections;
   a plurality of logic cells, each including CMOS logic gates and providing at least one respective output node;
   a shadow supply line, connected to said first power supply connection through a load element;
   a plurality of CMOS monitoring gates, each connected between said shadow supply line and said second power supply, and each connected to receive the voltage of one of said output nodes; and
   circuitry for detecting whether said shadow supply line has been pulled to a voltage which indicates that one or more of said CMOS monitoring gates are receiving voltages which are not proper logic levels.

2. The integrated circuit of claim 1, wherein said first power supply node is more positive than said second power supply.

3. The integrated circuit of claim 1, wherein said second power supply node is more positive than said first power supply.

4. The integrated circuit of claim 1, wherein said load is a static load.

5. The integrated circuit of claim 1, wherein said load is provided by a switched capacitor.

6. An integrated circuit, comprising:
   first and second power supply connections;
   a plurality of logic cells, each including CMOS logic gates and providing at least one respective output node;
   a shadow supply line, connected to said first power supply connection through a load element;
   a plurality of CMOS monitoring gates, each connected between said shadow supply line and said second power supply, and each connected to receive the voltage of one of said output nodes; and
   circuitry for detecting whether said shadow supply line has been pulled to a voltage which indicates that one or more of said CMOS monitoring gates are receiving voltages which are not proper logic levels;
   wherein first and second ones of said monitoring gates have respective intermediate nodes connected together, and are respectively connected to receive, as input voltages, the voltages of first and second ones of said output nodes which are expected to be complementary under static conditions.

7. The integrated circuit of claim 6, wherein not all of said monitoring gates have said respective intermediate nodes thereof connected together.

8. The integrated circuit of claim 6, wherein said first power supply node is more positive than said second power supply.

9. The integrated circuit of claim 6, wherein said second power supply node is more positive than said first power supply.

10. The integrated circuit of claim 6, wherein said load is a static load.

11. The integrated circuit of claim 6, wherein said load is provided by a switched capacitor.

12. The integrated circuit of claim 6, wherein said shadow supply line is provided by a metal trace of minimum width.

13. A method for internally detecting faults in an integrated circuit, comprising the steps of:
   operating a plurality of logic cells, each including CMOS logic gates and providing at least one respective output node, from the voltages provided by first and second power supply connections;
   pulling a shadow supply line toward said first power supply connection, by a connection through a load element;
   operating a plurality of CMOS monitoring gates, which are each connected between said shadow supply line and said second power supply, and each connected to receive the voltage of one of said output nodes as an input; and
   monitoring the voltage of said shadow supply line, and indicating a fault condition if said shadow supply line has been pulled to a voltage which indicates that one or more of said CMOS monitoring gates are receiving voltages which are not proper logic levels.

14. The method of claim 13, wherein said first power supply node is more positive than said second power supply.

15. The method of claim 13, wherein said second power supply node is more positive than said first power supply.

16. The method of claim 13, wherein said load is a static load.

17. The method of claim 13, wherein said load is provided by a switched capacitor.

18. The method of claim 13, wherein said shadow supply line is provided by a metal trace of minimum width.

19. A method for internally detecting faults in an integrated circuit, comprising the steps of:

operating a plurality of logic cells, each including CMOS logic gates and providing at least one respective output node, from the voltages provided by first and second power supply connections;

pulling a shadow supply line toward said first power supply connection, by a connection through a load element;

operating a plurality of CMOS monitoring gates, which are each connected between said shadow supply line and said second power supply, and each connected to receive the voltage of one of said output nodes as an input; and monitoring the voltage of said shadow supply line, and indicating a fault condition if said shadow supply line has been pulled to a voltage which indicates that one or more of said CMOS monitoring gates are receiving voltages which are not proper logic levels;

wherein first and second ones of said monitoring gates have respective intermediate nodes thereof connected together, and are respectively connected to receive, as input voltages, the voltages of first and second ones of said output nodes which are expected to be complementary under static conditions.

20. The method of claim 19, wherein not all of said monitoring gates have said respective intermediate nodes thereof connected together.

21. The method of claim 19, wherein said first power supply node is more positive than said second power supply.

22. The method of claim 19, wherein said second power supply node is more positive than said first power supply.

23. The method of claim 19, wherein said load is a static load.

24. The method of claim 19, wherein said load is provided by a switched capacitor.

25. The method of claim 19, wherein said shadow supply line is provided by a metal trace of minimum width.

26. A method of assessing the existence of critical resistive bridging faults in CMOS or BiCMOS logic ICs, characterized by sensing when the voltage present on at least one signal node assumes an intermediate value comprised between a preset intermediate voltage range which does not include normal logic levels, using said voltage present on at least one signal node as an input to a test inverter stage and detecting whether said test inverter stage passes current.

27. The subsystem of claim 26, characterized by deriving a test signal across said load.

28. A method according to claim 27, wherein said load is a resistive load.

29. A method according to claim 27, wherein said load is replaced by a capacitor functioning in a clocked (or dynamic) manner.

30. The method of claim 26, wherein the sensing is performed by means of a test inverter driven by said signal node and functionally connected to a supply rail though a load.

31. The subsystem of claim 30, characterized by deriving a test signal across said load.

32. A method according to claim 31, wherein said load is a resistive load.

33. A method according to claim 31, wherein said load is replaced by a capacitor functioning in a clocked (or dynamic) manner.

34. The method of claim 30, wherein said test inverter is designed in a manner to determine said preset intermediate voltage range.

35. The subsystem of claim 34, characterized by deriving a test signal across said load.

36. A method according to claim 35, wherein said load is a resistive load.

37. A method according to claim 35, wherein said load is replaced by a capacitor functioning in a clocked (or dynamic) manner.

38. A design-for-testability system for testing for the existence of faults in CMOS and BiCMOS ICs, comprising realizing at least one shadow supply rail connected through a load to one of two power supply rails of functional circuits;

realizing at least one test inverter stage, electrically connected to a shadow supply rail and to the other of said two supply rails of functional circuits and having an input connected to a signal node of a CMOS or BiCMOS functional circuit to be tested of the IC;

sensing a current through said load as an indication of the voltage present at the output node of a CMOS or BiCMOS functional circuit being tested of the IC reaching an intermediate level sufficient to cause conduction through the respective test inverter stage.

39. A system as defined in claim 38, wherein said current sensing load is a resistance.

40. A system as defined in claim 38, wherein said current sensing load is virtually implemented by a capacitor according to a clocked implementation of the system.

41. A system as defined in claim 38, wherein a plurality of test signals derived across a plurality of loads of as many test systems as defined in claim 1, are input to a network implementing a combinative logic function to produce a single output logic signal, representing a result of the test performed on the IC.

42. A design-for-testability circuit for testing for the existence of faults in CMOS and BiCMOS ICs, comprising at least one shadow supply rail connected through a load to one of two power supply rails of functional CMOS or BiCMOS circuits of the IC;

at least one test inverter stage, electrically connected to said shadow supply rail and to the other of said two supply rails of functional CMOS or BiCMOS circuits and having an input connected to an output node of a respective CMOS or BiCMOS circuit to be tested of the IC.

43. A circuit as defined in claim 42, wherein said load is a resistance.

44. A circuit as defined in claim 42, wherein said load is virtually implemented by a capacitor according to a clocked implementation of the system.

45. A circuit as defined in claim 42, characterized by comprising at least two of said test inverters and a connection between output nodes of said two test inverters.

46. A circuit as defined in claim 42, further comprising a circuit capable of sensing a signal across said load as an indication of the voltage present at the output node of a CMOS or BiCMOS gate being monitored of the IC, having a value sufficient to cause conduction through at least a monitoring test inverter stage.

47. A circuit as defined in claim 45, characterized by comprising a plurality of test circuits as defined in claim 11, and wherein a plurality of signals derived across a plurality of loads of as many test circuits, are input to a network implementing a combinative logic function to produce a single output logic signal, representing a result of the test performed on the IC.

* * * * *